(12) United States Patent
Khellah et al.

(10) Patent No.: US 8,667,367 B2
(45) Date of Patent: *Mar. 4, 2014

(54) MEMORY CELL SUPPLY VOLTAGE CONTROL BASED ON ERROR DETECTION

(75) Inventors: Muhammad Khellah, Tigard, OR (US); Dinesh Somasekhar, Portland, OR (US); Yibin Ye, Portland, OR (US); Nam Sung Kim, Hillsboro, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/215,949

(22) Filed: Aug. 23, 2011

(65) Prior Publication Data

US 2011/0307761 A1    Dec. 15, 2011

Related U.S. Application Data

(63) Continuation of application No. 11/542,007, filed on Sep. 29, 2006, now Pat. No. 8,006,164.

(51) Int. Cl.
*G11C 29/00* (2006.01)

(52) U.S. Cl.
USPC ............. 714/763; 365/200; 365/230.03

(58) Field of Classification Search
USPC .................. 714/763; 365/200, 230.03
See application file for complete search history.

(56) References Cited

U.S. PATENT DOCUMENTS

| | | | |
|---|---|---|---|
| 5,303,190 A | 4/1994 | Pelley, III | |
| 5,313,425 A | 5/1994 | Lee et al. | |
| 6,154,413 A | 11/2000 | Longwell et al. | |
| 6,178,537 B1 | 1/2001 | Roohparvar | |
| 6,181,608 B1 | 1/2001 | Keshavarzi et al. | |
| 6,191,606 B1 | 2/2001 | Ye et al. | |
| 6,232,893 B1* | 5/2001 | Cliff et al. | 341/78 |
| 6,285,621 B1 | 9/2001 | Beer | |
| 6,329,874 B1 | 12/2001 | Ye et al. | |
| 6,400,206 B2 | 6/2002 | Kim et al. | |
| 6,496,040 B1 | 12/2002 | Narendra et al. | |
| 6,515,513 B2 | 2/2003 | Ye et al. | |
| 6,519,176 B1 | 2/2003 | Hamzaoglu et al. | |

(Continued)

FOREIGN PATENT DOCUMENTS

| | | |
|---|---|---|
| KR | 10-98781 | 1/1996 |
| KR | 1996-681 B1 | 1/1996 |
| KR | 10-281152 | 3/2001 |
| WO | 2007/063264 A1 | 6/2007 |

OTHER PUBLICATIONS

Kim, H., et al., "Dual-Level Voltage Shifters for Low Leakage Power", U.S. Appl. No. 09/354,484, filed Jul. 16, 1999.

(Continued)

*Primary Examiner* — Sam Rizk
(74) *Attorney, Agent, or Firm* — Blakely, Sokoloff, Taylor & Zafman LLP

(57) ABSTRACT

Described herein is an apparatus for adjusting a power supply level for a memory cell to improve stability of a memory unit. The apparatus comprises memory circuitry including memory cells, error detection circuitry to detect error in data stored by memory cells of the memory circuitry, and supply voltage control circuitry to increase supply voltage for one or more memory cells of the memory circuitry based at least in part on detected error.

22 Claims, 8 Drawing Sheets

(56) References Cited

U.S. PATENT DOCUMENTS

| | | | |
|---|---|---|---|
| 6,552,887 B1 | 4/2003 | Karnik et al. | |
| 6,560,725 B1 | 5/2003 | Longwell et al. | |
| 6,567,329 B2 | 5/2003 | Somasekhar et al. | |
| 6,608,786 B2 | 8/2003 | Somasekhar et al. | |
| 6,643,199 B1 | 11/2003 | Tang et al. | |
| 6,654,277 B1 * | 11/2003 | Hsu et al. | 365/154 |
| 6,707,708 B1 | 3/2004 | Alvandpour et al. | |
| 6,724,648 B2 | 4/2004 | Khellah et al. | |
| 6,724,649 B1 | 4/2004 | Ye et al. | |
| 6,801,463 B2 | 10/2004 | Khellah et al. | |
| 6,801,465 B2 | 10/2004 | Somasekhar et al. | |
| 6,831,871 B2 | 12/2004 | Khellah et al. | |
| 6,876,571 B1 | 4/2005 | Khellah et al. | |
| 6,906,973 B1 | 6/2005 | Somasekhar et al. | |
| 6,909,652 B2 | 6/2005 | Ye et al. | |
| 6,985,380 B2 | 1/2006 | Khellah et al. | |
| 7,020,041 B2 | 3/2006 | Somasekhar et al. | |
| 7,120,804 B2 | 10/2006 | Tschanz et al. | |
| 7,206,249 B2 | 4/2007 | Khellah et al. | |
| 7,268,569 B2 | 9/2007 | Vassighi et al. | |
| 7,342,845 B2 | 3/2008 | Somasekhar et al. | |
| 7,385,865 B2 | 6/2008 | Khellah et al. | |
| 7,463,057 B1 * | 12/2008 | Rahim et al. | 326/38 |
| 7,558,097 B2 | 7/2009 | Khellah et al. | |
| 7,581,154 B2 | 8/2009 | Rai et al. | |
| 7,653,850 B2 | 1/2010 | Tschanz et al. | |
| 7,710,295 B2 | 5/2010 | Somasekhar et al. | |
| 7,859,081 B2 | 12/2010 | Doyle et al. | |
| 8,006,164 B2 | 8/2011 | Muhammad et al. | |
| 2005/0223251 A1 | 10/2005 | Liepe et al. | |
| 2006/0280019 A1 | 12/2006 | Burton et al. | |
| 2007/0002607 A1 | 1/2007 | Khellah et al. | |
| 2007/0165477 A1 | 7/2007 | Dempsey | |
| 2007/0168848 A1 | 7/2007 | Tschanz et al. | |
| 2007/0271421 A1 | 11/2007 | Kim et al. | |
| 2008/0080266 A1 | 4/2008 | Khellah et al. | |
| 2008/0143407 A1 | 6/2008 | Schrom et al. | |
| 2008/0162986 A1 | 7/2008 | Kim et al. | |
| 2008/0237678 A1 | 10/2008 | Datta et al. | |
| 2009/0006742 A1 | 1/2009 | Huang et al. | |
| 2009/0083495 A1 | 3/2009 | Khellah et al. | |
| 2009/0161442 A1 * | 6/2009 | New et al. | 365/189.04 |

OTHER PUBLICATIONS

Agostinelli, M., et al., "Erratic Fluctuations of SRAM Cache Vmin at the 90nm Process Technology Node", Electron Devices Meeting, IEDM Technical Digest, pp. 655-658 (Dec. 5, 2005).

Hareland, Scott, et al., "Impact of CMOS Process Scaling and SOI on the Soft Error Rates of Logic Processes", Symposium on VLSI Technology Digest of Technical Papers, pp. 73-74 (Jun. 12-14, 2001).

UK Intellectual Property Office Combined Search and Examination Report for corresponding Patent Application No. GB0719014.3, mailed Feb. 11, 2008, 5 pages.

Korean Intellectual Property Office Notice of Preliminary Rejection for corresponding Patent Application No. 10-2007-98725, mailed Oct. 31, 2008, 4 pages.

English Translation of Korean Intellectual Property Office Notice of Preliminary Rejection for corresponding Patent Application No. 10-2007-98725, mailed Oct. 31, 2008, 3 pages.

Korean Intellectual Property Office Notice of Last Preliminary Rejection for corresponding Patent Application No. 10-2007-98725, mailed Apr. 9, 2009, 4 pages.

English Translation of Korean Intellectual Property Office Notice of Last Preliminary Rejection for corresponding Patent Application No. 10-2007-98725, mailed Apr. 9, 2009, 3 pages.

Korean Intellectual Property Office Notice of Final Rejection for corresponding Patent Application No. 10-2007-98725, mailed Jan. 28, 2010, 3 pages.

English Translation of Korean Intellectual Property Office Notice of Final Rejection for corresponding Patent Application No. 10-2007-98725, mailed Jan. 28, 2010, 3 pages.

Non-Final Office Action mailed Dec. 13, 2010 for U.S. Appl. No. 11/542,007.

Non-Final Office Action mailed Jan. 11, 2010 for U.S. Appl. No. 11/542,007.

Notice of Allowance mailed Apr. 25, 2011 for U.S. Appl. No. 11/542,007.

Notice of Allowance mailed Aug. 19, 2010 for U.S. Appl. No. 11/542,007.

First Office Action mailed Jul. 4, 2012 for German Patent Application No. 10 2007 046 954.5-55.

Office Action received in Korean Patent Application No. 10-2007-98725, mailed Aug. 24, 2012, 14 pgs of Office Action, including 3 pages of English summary translation.

Notice of Final Rejection issued for Korean Patent Application No. 10-2010-50076, mailed Aug. 22, 2013, 5 pages.

Non-Final Office Action issued for U.S. Appl. No. 13/626,435, mailed Jun. 6, 2013, 14 pages.

Notice of Allowance issued for U.S. Appl. No. 13/626,435, mailed Oct. 25, 2013, 9 pages.

* cited by examiner

# MEMORY CELL SUPPLY VOLTAGE CONTROL BASED ON ERROR DETECTION

RELATED APPLICATIONS

The present application is a continuation of, and claims priority to and incorporates by reference in its entirety, the corresponding U.S. patent application Ser. No. 11/542,007 filed Sep. 29, 2006, and entitled, "MEMORY CELL SUPPLY VOLTAGE CONTROL BASED ON ERROR DETECTION," and issued as U.S. Pat. No. 8,006,164 on Aug. 23, 2011.

FIELD

Embodiments described herein generally relate to memory.

BACKGROUND

FIG. 1 illustrates a circuit diagram for a prior art six transistor (6T) memory cell 1 for a static random access memory (SRAM). As illustrated in FIG. 1, memory cell 1 has two cross-coupled inverters 10 and 20 coupled between a supply voltage $V_{SUPPLY}$ node and a ground node to generate complementary signals at storage nodes 11 and 21. Inverter 10 has a pull-up p-channel field effect transistor (PFET) 12 and a pull-down n-channel FET (NFET) 14. The gates of PFET 12 and NFET 14 are both coupled to receive a signal at storage node 21 to generate an inverted signal at storage node 11. Similarly, inverter 20 has a pull-up PFET 22 and a pull-down NFET 24. The gates of PFET 22 and NFET 24 are both coupled to receive a signal at storage node 11 to generate an inverted signal at storage node 21. The complementary signals at storage nodes 11 and 21 represent a single binary value depending on which signal is at which storage node 11 or 21.

Memory cell 1 also has NFETs 16 and 26 to access memory cell 1 to read a binary value from and/or write a binary value to memory cell 1. The gate of NFET 16 is coupled to receive a signal on a word line 30 to couple storage node 11 to a bit line 31. The gate of NFET 26 is coupled to receive a signal on word line 30 to couple storage node 21 to a bit line 32. Memory cell 1 may then be accessed by sensing the complementary signals on bit lines 31 and 32 to read the binary value stored by memory cell 1 or by asserting complementary signals on bit lines 31 and 32 to write a binary value to memory cell 1. NFETs 16 and 26 are known as transfer, access, or pass transistors.

To speed reading the binary value, PFETs 41, 42, and 43 are activated in response to a signal on a precharge line 40 to precharge bit lines 31 and 32 by coupling them to a supply voltage $V_{SUPPLY}$ node. The binary value may then be read as soon as bit line 31 is pulled down by NFET pair 14 and 16 or bit line 32 is pulled down by NFET pair 24 and 26 without having to wait for the other bit line 32 or 31 to be pulled up.

Memory cell 1 may be designed to help meet a desired level of stability for a given memory size and process to help improve manufacturing yield. Memory cell 1 may be designed, for example, to account for mismatch in threshold voltage Vth of neighboring transistors as such mismatch reduces stability. As transistor dimensions are scaled, accounting for threshold voltage mismatch can prove challenging as the variability in the number and location of channel dopant atoms can result in restrictive electrical deviations in transistor threshold voltages Vth.

Read stability can be loosely defined as the probability that memory cell 1 will retain its stored binary value during a read operation. Memory cell 1 is more susceptible to noise during a read operation because the voltage at the low storage node, such as storage node 21 for example, will rise due to the voltage division by neighboring NFETs 24 and 26 between precharged bit line 32 and the ground node when NFET 26 is activated by a high signal on word line 30. Read stability is therefore generally proportional to the ratio of the transconductance of NFET 24 relative to that of NFET 26.

Write stability can be loosely defined as the probability that memory cell 1 will be written with an intended binary value during a write operation. Because a write is performed by discharging the voltage at the high storage node, such as storage node 21 for example, through NFET 26, write stability is generally proportional to the ratio of the transconductance of NFET 26 relative to that of PFET 22.

Example ways to improve stability of memory cell 1 include (1) sizing pull-down NFET 14 and 24 to have an increased width at the expense of increased cell area and reduced write stability, (2) sizing access NFET 16 and 26 to have a larger channel length at the expense of reduced read current and therefore reduced read operation speed, and/or (3) adding a scalable negative supply voltage generator to drive the source of pull-down NFET 14 and 24 to a negative voltage before word line 30 is activated to increase the strength of pull-down NFET 14 and 24.

BRIEF DESCRIPTION OF THE DRAWINGS

Embodiments are illustrated by way of example and not limitation in the figures of the accompanying drawings, in which like references indicate similar elements and in which.

The figures of the drawings are not necessarily drawn to scale.

DETAILED DESCRIPTION

The following detailed description sets forth example embodiments of apparatuses, methods, and systems relating to memory cell supply voltage control based on error detection. Features, such as structure(s), function(s), and/or characteristic(s) for example, are described with reference to one embodiment as a matter of convenience; various embodiments may be implemented with any suitable one or more described features.

Figure 2:
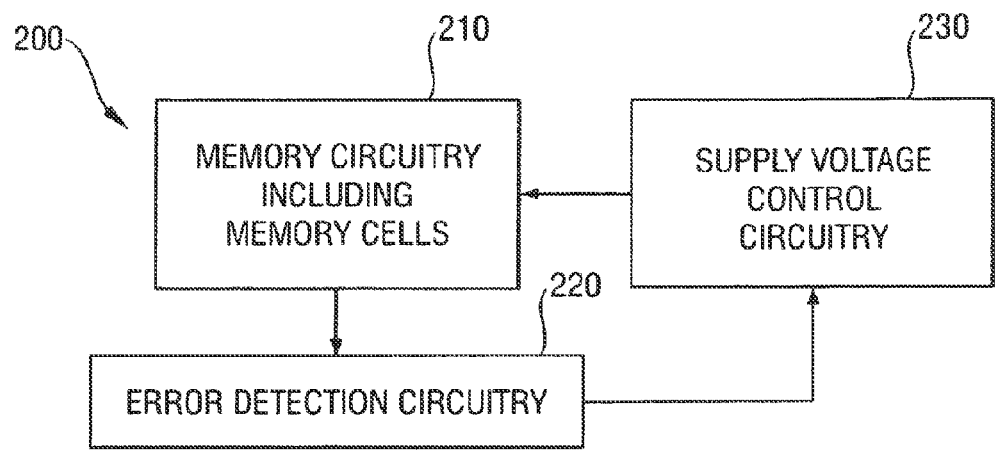
FIG. 2 illustrates, for one embodiment, a block diagram of circuitry to control memory cell supply voltage based at least in part on error detection.

FIG. 2 illustrates circuitry 200 to control memory cell supply voltage based at least in part on error detection. Circuitry 200 for one embodiment, as illustrated in FIG. 2, may include memory circuitry 210 including memory cells, error detection circuitry 220 to detect error in data stored by memory cells of memory circuitry 210, and supply voltage control circuitry 230 to increase supply voltage for one or more memory cells of memory circuitry 210 based at least in part on detected error.

Supply voltage control circuitry 230 for one embodiment may increase supply voltage for one or more memory cells having error. Supply voltage control circuitry 230 for one embodiment may increase supply voltage for one or more memory cells without increasing supply voltage for one or more other memory cells.

Increasing supply voltage for one or more memory cells of memory circuitry 210 for one embodiment may help improve stability of such memory cell(s). Providing increase in supply voltage for memory cell(s) of memory circuitry 210 for one embodiment may be used in addition to and/or in lieu of any suitable other design technique to improve stability. Memory circuitry 210 for one embodiment may therefore be designed with increased flexibility to meet a desired level of stability.

By providing selective increase in supply voltage for one or more memory cells having error, stability of one or more memory cells of memory circuitry 210 for one embodiment may be improved without having to provide an increased supply voltage for all memory cells of memory circuitry 210. Some memory cells of memory circuitry 210 for one embodiment may therefore remain powered at a lower supply voltage, helping to reduce power consumption and/or heat dissipation.

By providing error detection of data stored in memory cells of memory circuitry 210, stability of memory cells in memory circuitry 210 for one embodiment may be checked periodically over time to help identify and compensate for any reduced stability from device degradation due to aging. Error detection circuitry 220 for one embodiment may check data to detect error dynamically as data is read from memory circuitry 210.

Figure 3:
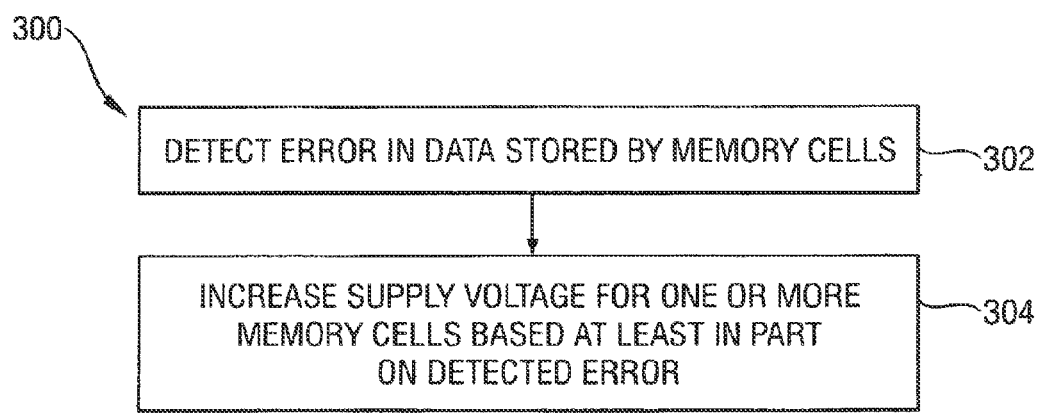
FIG. 3 illustrates, for one embodiment, a flow diagram to control memory cell supply voltage based at least in part on error detection for the block diagram of FIG. 2.

FIG. 3 illustrates, for one embodiment, a flow diagram 300 to control memory cell supply voltage based at least in part on error detection. For block 302 of FIG. 3, error detection circuitry 220 may detect error in data stored by memory cells of memory circuitry 210. For block 304, supply voltage control circuitry 230 may increase supply voltage for one or more memory cells based at least in part on detected error.

Figure 4:
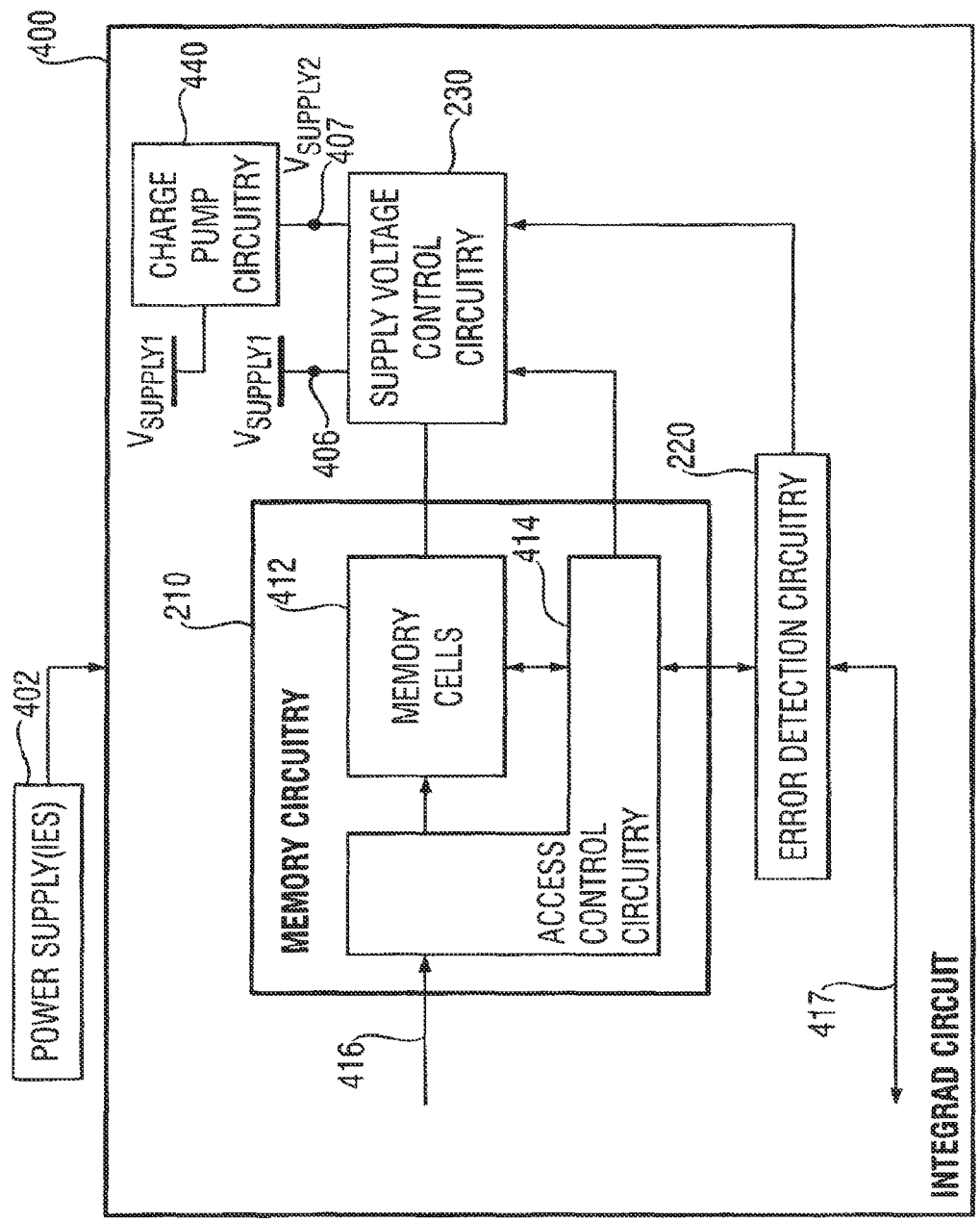
FIG. 4 illustrates, for one embodiment, a block diagram of an integrated circuit having circuitry to control memory cell supply voltage based at least in part on error detection.

Memory circuitry 210 may include any suitable circuitry to store and access data in memory cells in any suitable manner. Memory circuitry 210 for one embodiment, as illustrated in FIG. 4, may include memory cells 412 and access control circuitry 414.

Figure 1:
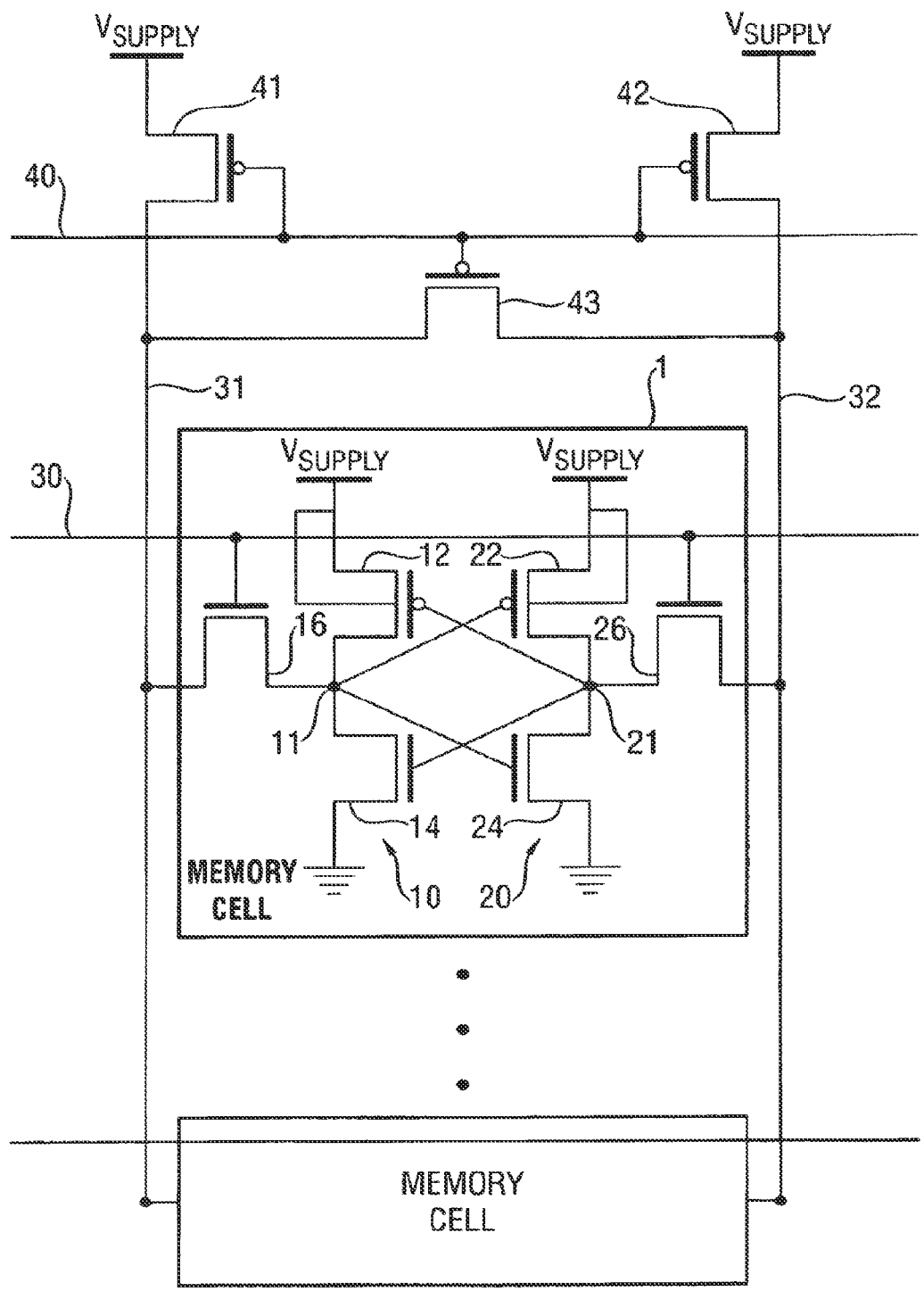
FIG. 1 illustrates a circuit diagram for a prior art six transistor (6T) memory cell for a static random access memory (SRAM)

Memory cells 412 may include any suitable circuitry to implement any suitable memory cells to store data in any suitable manner. Memory cells 412 for one embodiment may include any suitable circuitry to implement one or more memory cells that store one bit of data. Memory cells 412 for one embodiment may include any suitable circuitry to implement any suitable one or more static random access memory (SRAM) cells. Memory cells 412 for one embodiment may include any suitable circuitry to implement any suitable one or more six transistor (6T) SRAM memory cells. Memory cells 412 for one embodiment may, for example, include circuitry for a 6T SRAM memory cell similar to that shown in FIG. 1.

Access control circuitry 414 may include any suitable circuitry coupled to access data in memory cells 412 in any suitable manner. Access control circuitry 414 for one embodiment may be coupled to receive address and/or control signals on lines 416 and may be coupled to receive and/or transmit data on one or more lines 417. Access control circuitry 414 for one embodiment may receive address signals to identify one or more of memory cells 412 from which data is to be read and transmitted on line(s) 417 or to which data is to be written from line(s) 417. Access control circuitry 414 for one embodiment may receive one or more control signals to identify whether data is to be written to or read from memory cells 412.

Error detection circuitry 220 may include any suitable circuitry to detect error in data stored by memory cells 412 in any suitable manner. Error detection circuitry 220 for one embodiment, as illustrated in FIG. 4, may be coupled to receive data read from memory cells 412 by access control circuitry 414 and check such read data to detect error in such data. Error detection circuitry 220 for one embodiment may be coupled to transmit on line(s) 417 data that has been checked for error. Error detection circuitry 220 for one embodiment may check data for error as data is requested from memory cells 412 by other circuitry. Error detection circuitry 220 for one embodiment may check data for error as part of a periodic test of memory cells 412. Error detection circuitry 220 for one embodiment may periodically check data to help identify any memory cells having reduced stability from device degradation due to aging.

Error detection circuitry 220 for one embodiment, as illustrated in FIG. 4, may be coupled to receive on line(s) 417 data to be written to memory cells 412, generate error detection data based at least in part on at least a portion of the received data, and transmit the received data to write to memory cells 412. Error detection circuitry 220 for one embodiment may later use such error detection data to check the written data for error. Error detection circuitry 220 for one embodiment may transmit such error detection data to store in memory cells 412 in association with the data to be written to memory cells 412. When data stored in memory cells 412 are to be checked to detect error, error detection circuitry 220 for one embodiment may then read associated error detection data to detect error.

Error detection circuitry 220 for one embodiment may include any suitable circuitry to correct error in data in any suitable manner. Error detection circuitry 220 for one embodiment may correct data in which error has been detected and may be coupled to transmit on line(s) 417 data having corrected error in any suitable manner. For one embodiment where error detection circuitry 220 may generate error detection data, error detection circuitry 220 for one embodiment may use such error detection data to correct error in data.

Error detection circuitry 220 for one embodiment may generate and use any suitable error detection data to detect and/or correct error in data stored by memory cells 412 in any suitable manner. Error detection circuitry 220 for one embodiment may generate and use any suitable checksum data to detect and/or correct error. Error detection circuitry 220 for one embodiment may generate and use any suitable error correction code (ECC), such as single error correct double error detect (SECDED) ECC or double error correct triple error detect (DECTED) ECC for example, to detect and/or correct error.

Supply voltage control circuitry 230 may include any suitable circuitry to increase supply voltage for one or more of memory cells 412 based at least in part on detected error in any suitable manner. Supply voltage control circuitry 230 for one embodiment may increase supply voltage for one or more of memory cells 412 having error. Supply voltage control circuitry 230 for one embodiment may increase supply voltage for one or more of memory cells 412 without increasing supply voltage for one or more other memory cells. Supply voltage control circuitry 230 for one embodiment may increase supply voltage for a plurality of memory cells that include one or more memory cells having error. Supply voltage control circuitry 230 for one embodiment may increase supply voltage for a predetermined subset of memory cells that include one or more memory cells having error.

Supply voltage control circuitry 230 for one embodiment may be coupled to receive one or more signals on lines 416 and/or generated from access control circuitry 414 to identify accessed memory cells from which data is read and checked by error detection circuitry 220 to detect error. The identified accessed memory cell(s) for one embodiment may correspond to a predetermined subset of memory cells, such as memory cells to store data that define a word for example. Error detection circuitry 220 for one embodiment may be coupled to generate one or more control signals to signal supply voltage control circuitry 230 to increase supply voltage for one or more of the identified accessed memory cells if error is detected in the read data. Error detection circuitry 220 for one embodiment may signal supply voltage control circuitry 230 that error has been detected in the read data, and supply voltage control circuitry 230 for one embodiment may then increase supply voltage for the identified accessed memory cells. Error detection circuitry 220 for one embodiment may identify to supply voltage control circuitry 230 one or more memory cells that have error, and supply voltage control circuitry 230 for one embodiment may increase supply voltage for such identified memory cell(s).

Supply voltage control circuitry 230 may include any suitable circuitry to increase supply voltage for one or more of memory cells 412 in any suitable manner. Supply voltage control circuitry 230 for one embodiment may switch supply voltage for one or more of memory cells 412 to a greater voltage. Supply voltage control circuitry 230 for one embodiment may decouple one or more memory cells from one or more supply nodes having a supply voltage $V_{SUPPLY1}$, represented in FIG. 4 as a single node 406 for convenience, and couple such memory cell(s) to another one or more supply nodes having a supply voltage $V_{SUPPLY2}$, represented in FIG. 4 as a single node 407 for convenience, where the supply voltage $V_{SUPPLY2}$ is greater than the supply voltage $V_{SUPPLY1}$. The supply voltages $V_{SUPPLY1}$ and $V_{SUPPLY2}$ may have any suitable values.

Memory circuitry 210, error detection circuitry 220, and supply voltage control circuitry 230 for one embodiment, as illustrated in FIG. 4, may be integrated on an integrated circuit 400. Integrated circuit 400, as illustrated in FIG. 4, may be coupled to receive power from one or more external power supplies 402 to generate the supply voltages $V_{SUPPLY1}$ and $V_{SUPPLY2}$. Power supply(ies) 402 for one embodiment may include one or more energy cells, such as a battery and/or a fuel cell for example. Power supply(ies) 402 for one embodiment may include an alternating current to direct current (AC-DC) converter. Power supply(ies) 402 for one embodiment may include a DC-DC converter. Power supply(ies) 402 for one embodiment may include one or more voltage regulators to help supply power to integrated circuit 400.

Integrated circuit 400 for one embodiment may be coupled to receive the supply voltage $V_{SUPPLY1}$ and/or the supply voltage $V_{SUPPLY2}$. Integrated circuit 400 for one embodiment may include any suitable circuitry, such as one or more voltage regulators for example, to generate the supply voltage $V_{SUPPLY1}$ and/or the supply voltage $V_{SUPPLY2}$. For one embodiment, as illustrated in FIG. 4, integrated circuit 400 may include charge pump circuitry 440 to generate the supply voltage $V_{SUPPLY2}$. Charge pump circuitry 440 may include any suitable circuitry to generate the supply voltage $V_{SUPPLY2}$ in any suitable manner. Charge pump circuitry 440 for one embodiment may be coupled to receive the supply voltage $V_{SUPPLY1}$ to generate the supply voltage $V_{SUPPLY2}$.

Figure 5:
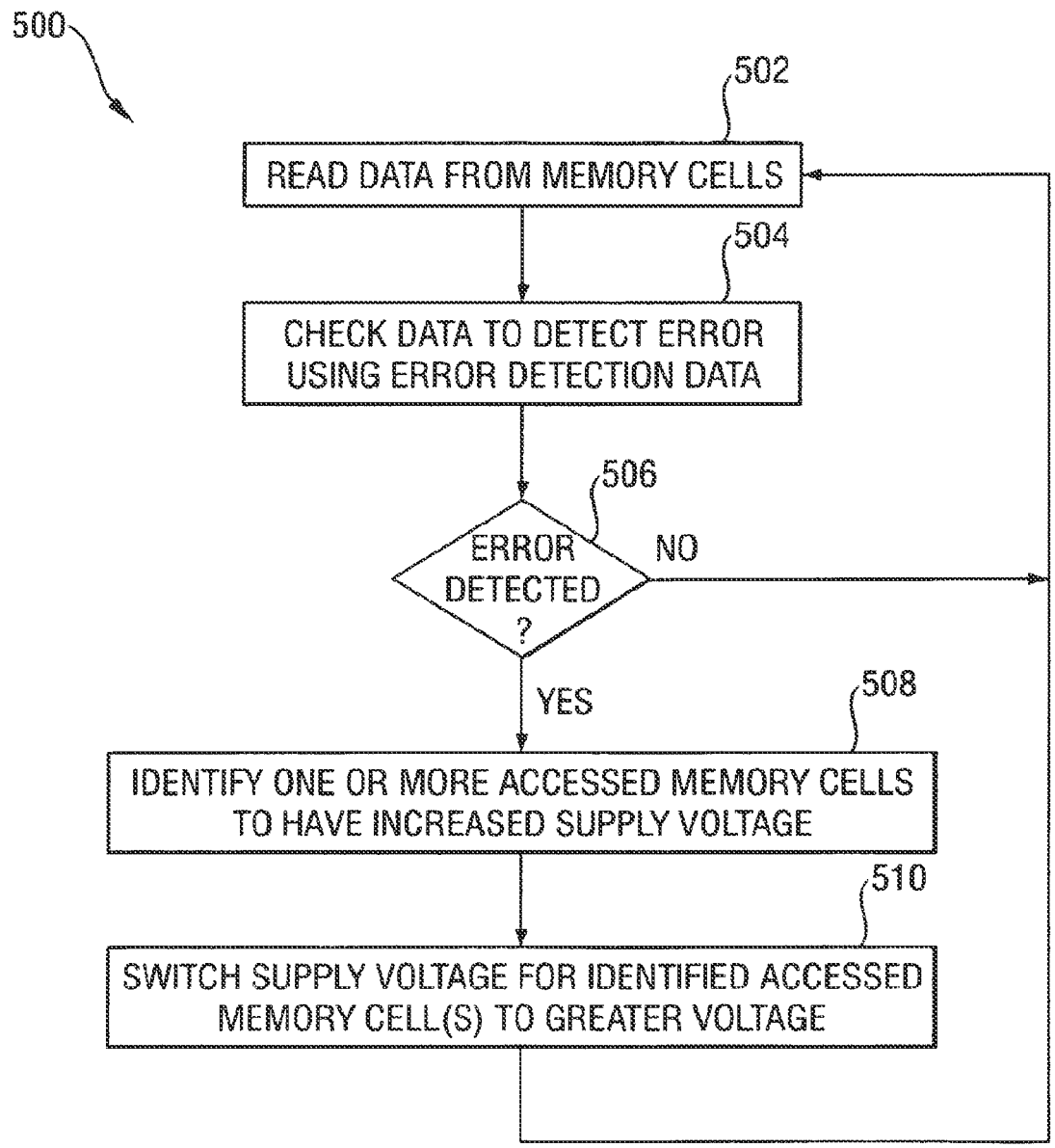
FIG. 5 illustrates, for one embodiment, a flow diagram to control memory cell supply voltage based at least in part on error detection for the block diagram of FIG. 4.

FIG. 5 illustrates, for one embodiment, a flow diagram 500 to control memory cell supply voltage based at least in part on error detection. For block 502 of FIG. 5, access control circuitry 414 may read data from memory cells 412. Error detection circuitry 220 for block 504 may check the read data to detect error using error detection data. If error is detected for block 506, access control circuitry 414 and/or error detection circuitry 220 for block 508 may identify to supply voltage control circuitry 230 one or more accessed memory cells to have increased supply voltage. Supply voltage control circuitry 230 for block 510 may switch supply voltage for such identified accessed memory cell(s) to a greater voltage $V_{SUPPLY2}$.

Example Circuitry

Figure 6:
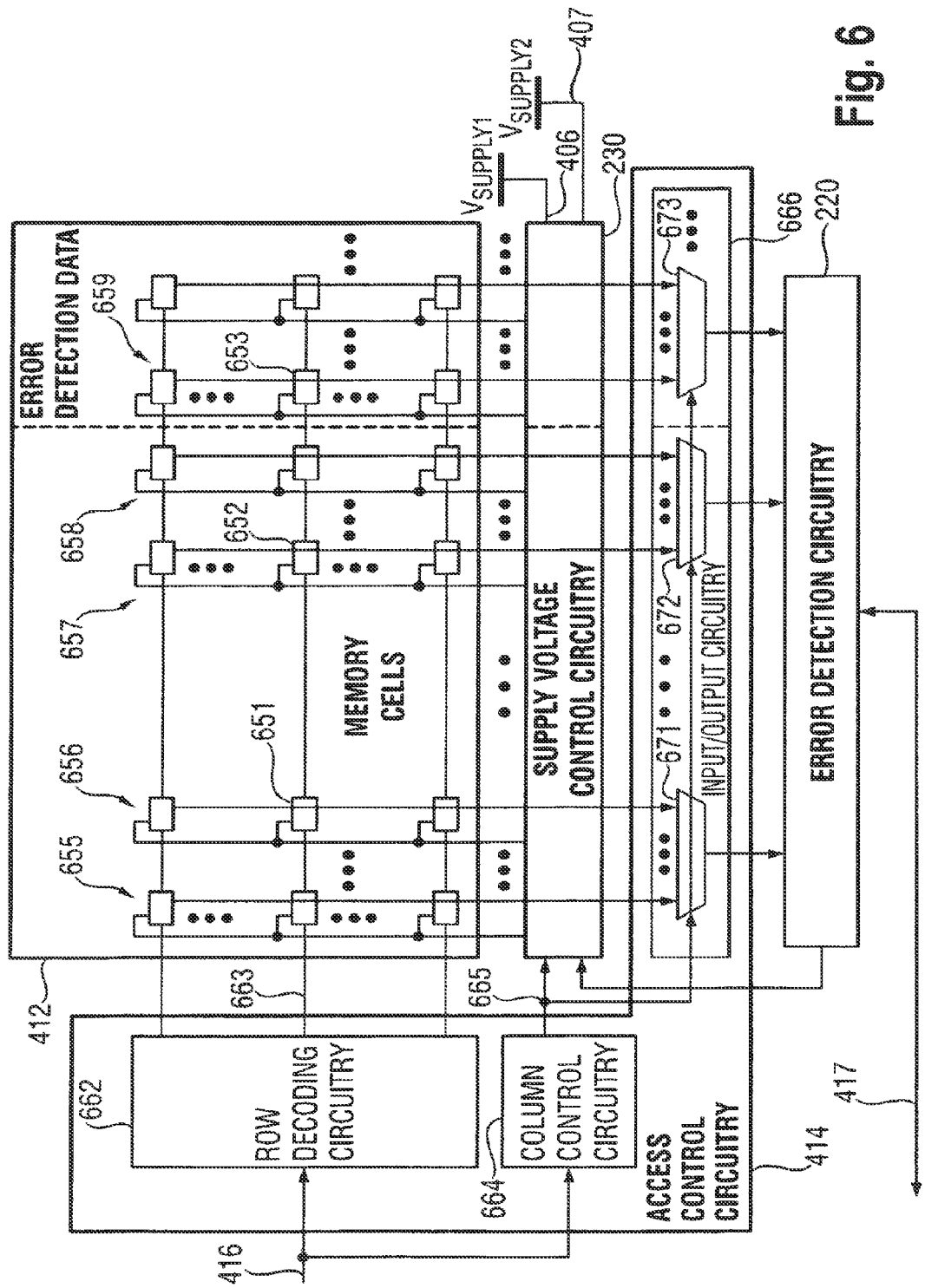
FIG. 6 illustrates, for one embodiment, example circuitry for memory circuitry of FIG. 4.

FIG. 6 illustrates, for one embodiment, example circuitry for memory circuitry 210 illustrated in FIG. 4.

Memory cells 412 for one embodiment, as illustrated in FIG. 6, may include circuitry for an array of any suitable number of memory cells, such as memory cells 651, 652, and 653 for example, logically arranged in any suitable number of rows and any suitable number of columns, such as columns 655, 656, 657, 658, and 659 for example. Memory cells 412 for one embodiment may include any suitable circuitry to implement one or more memory cells that store one bit of data. Memory cells 412 for one embodiment may include any suitable circuitry to implement any suitable one or more six transistor (6T) SRAM memory cells, such as a 6T SRAM memory cell similar to that shown in FIG. 1.

Access control circuitry 414 for one embodiment, as illustrated in FIG. 6, may include row decoding circuitry 662, column control circuitry 664, and input/output (I/O) circuitry 666.

Row decoding circuitry 662 for one embodiment may be coupled to receive at least a portion of an address on lines 416 and to generate a signal on a word line, such as a word line 663 for example, to select memory cells in a row in response to the received address portion. Column control circuitry 664 for one embodiment may be coupled to receive at least a portion of the address and to generate one or more signals on one or more column select lines 665 to select memory cells in columns in response to the received address portion. Memory cells 412 for one embodiment may store both data and associated error correction data in the same row across corresponding columns.

Column control circuitry 664 for one embodiment may generate signal(s) on column select line(s) 665 to control multiplexers of I/O circuitry 666, such as multiplexers 671, 672, and 673 for example, to select columns and output data stored by memory cells in both a row selected by row decoding circuitry 662 and selected columns. Column control circuitry 664 for one embodiment may generate signal(s) on column select line(s) 665 to control multiplexers 671, 672, and 673, for example, to select columns 655, 657, and 659 for example. I/O circuitry 666 may include any suitable number of multiplexers to select between or among any suitable number of columns of memory cells. For one embodiment where memory cells 412 include one-bit memory cells, I/O circuitry 666 for one embodiment may include, for example, 37 multiplexers that select one of eight columns to output 32 bits or a word of data from 32 of 256 memory cells in a selected row and to output 5 bits of associated error correction data from 5 of an additional 40 memory cells in that selected row.

I/O circuitry 666 for one embodiment may include precharge circuitry coupled to precharge bit lines coupled to memory cells in columns. I/O circuitry 666 for one embodiment may include sense amplifiers coupled to sense on bit line pairs corresponding to selected columns of memory cells complementary signals from memory cells in a selected row and to output corresponding amplified complementary signals or an amplified signal representative of a binary value corresponding to the sensed complementary signals. I/O circuitry 666 for one embodiment may include write drivers. A write driver may be coupled to receive a signal or complementary signals representative of a binary value on line(s) 417 and to assert corresponding complementary signals on bit line pairs corresponding to selected columns of memory cells to write to memory cells in a selected row.

Error detection circuitry 220 for one embodiment may be coupled to receive data and associated error detection data from I/O circuitry 666 to detect error in received data using the associated error detection data. Error detection circuitry 220 for one embodiment may be coupled to generate one or more control signals to signal supply voltage control circuitry 230 to increase supply voltage for accessed memory cells if error is detected in received data.

Supply voltage control circuitry 230 for one embodiment, as illustrated in FIG. 6, may be coupled to control supply voltage for separate columns of memory cells. Supply voltage control circuitry 230 for one embodiment may be coupled to receive signal(s) on column select line(s) 665 to identify selected columns of memory cells and may be coupled to receive control signal(s) from error detection circuitry 220 to identify whether supply voltage is to be increased for memory cells in selected columns. Supply voltage control circuitry 230 for one embodiment may control supply voltage for selected columns to share power supply lines for memory cells in a column to help meet desired density constraints. Supply voltage control circuitry 230 for one embodiment may control supply voltage for selected columns to benefit from use of column select line(s) 665 to help reduce control overhead and/or circuitry for supply voltage control circuitry 230. Supply voltage control circuitry 230 for one embodiment may maintain supply voltage for memory cells in columns used to store error detection data to help better ensure such memory cells remain relatively stable.

Figure 7:
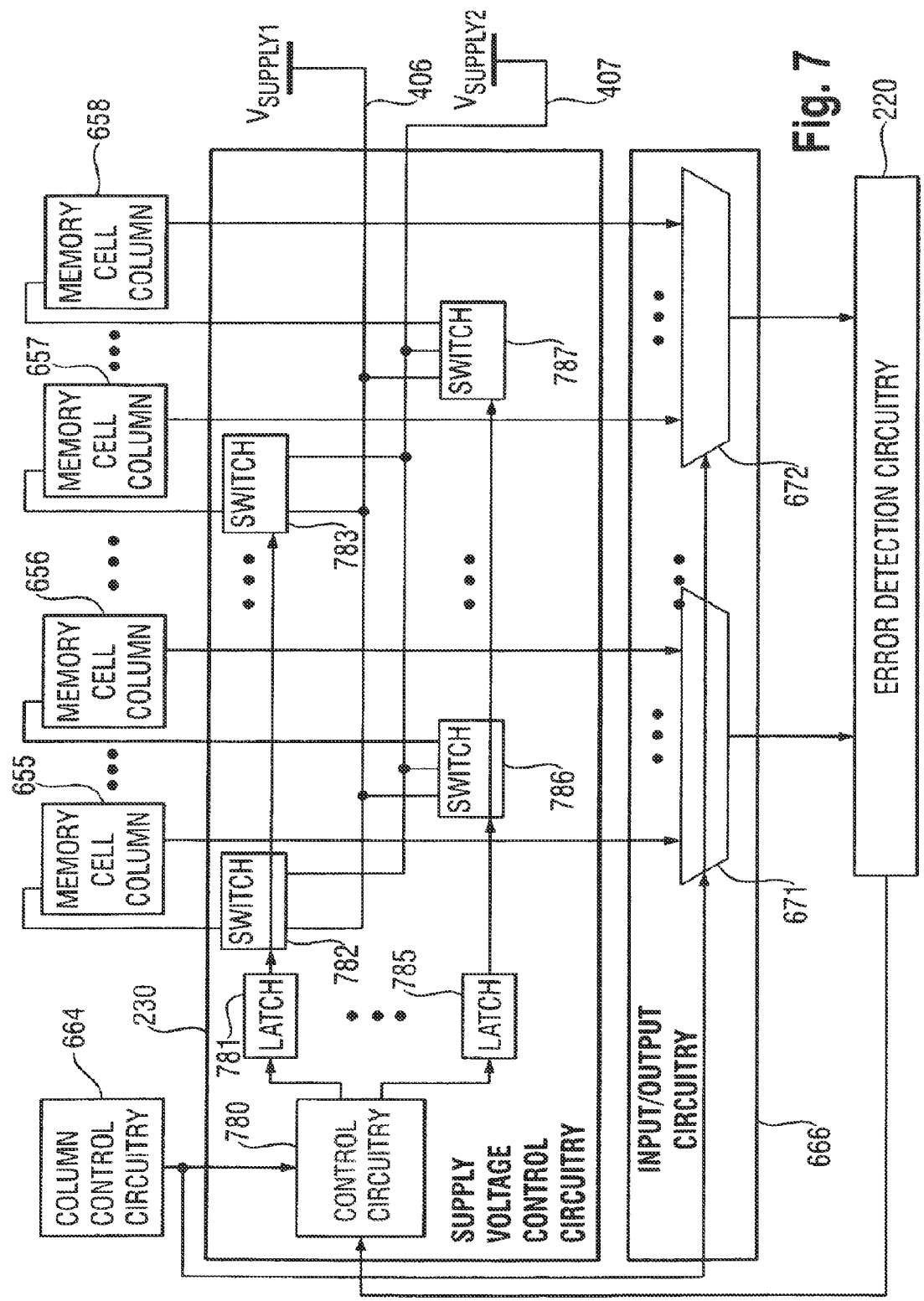
FIG. 7 illustrates, for one embodiment, example circuitry for supply voltage control circuitry of FIG. 6.

Supply voltage control circuitry 230 for one embodiment, as illustrated in FIG. 7, may include control circuitry 780 coupled to receive signal(s) on column select line(s) 665 to select one of a plurality of latches, such as latches 781 and 785 for example. Control circuitry 780 for one embodiment may also be coupled to receive a control signal from error detection circuitry 220 to output a control signal to the selected latch to control supply voltage for memory cells in selected columns.

The latches for one embodiment may be coupled to control corresponding switches coupled to control supply voltage for memory cells in corresponding columns. A latch for one embodiment may generally correspond to columns that may be selected by multiplexers of I/O circuitry 666, such as multiplexers 671 and 672 for example, in response to signal(s) on column select line(s) 665. As one example, latch 781 may be coupled to control a switch 782 to control supply voltage for memory cells in column 655 and to control a switch 783 to control supply voltage for memory cells in column 657. As another example, latch 785 may be coupled to control a switch 786 to control supply voltage for memory cells in column 656 and to control a switch 787 to control supply voltage for memory cells in column 658. A latch selected by control circuitry 780 to receive and latch a control signal to increase supply voltage for memory cells in selected columns for one embodiment may control corresponding switches to switch supply voltage for memory cells in selected columns from supply voltage $V_{SUPPLY1}$ to a greater supply voltage $V_{SUPPLY2}$.

Control circuitry 780 for one embodiment may optionally track which columns are to have an increased supply voltage to again increase supply voltage for such columns following a power loss or reset. Control circuitry 780 for one embodiment may store in any suitable non-volatile memory or storage device controls signals corresponding to control signals latched by the latches.

Figure 8:
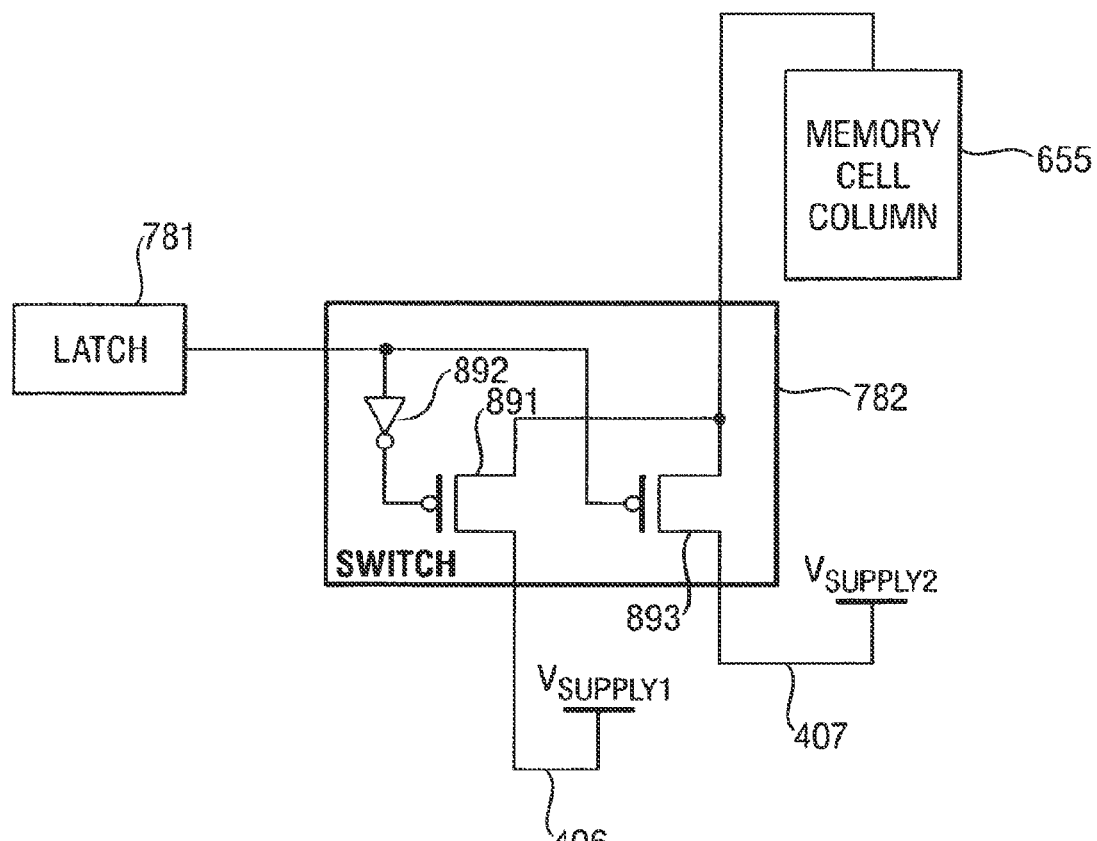
FIG. 8 illustrates, for one embodiment, example circuitry for a switch of FIG. 7.

Switches of supply voltage control circuitry 230 may include any suitable circuitry to switch supply voltage for memory cells in corresponding columns from supply voltage $V_{SUPPLY1}$ to a greater supply voltage $V_{SUPPLY2}$. As one example, as illustrated in FIG. 8, switch 782 for one embodiment may include a pull-up p-channel field effect transistor (PFET) 891 and another pull-up PFET 893. PFET 893 may be coupled to receive a control signal output from latch 781 while PFET 891 may be coupled to receive the control signal through an inverter 892 to activate only one of PFET 891 or PFET 893. In response to a first control signal corresponding to a binary value of one output from latch 781, PFET 891 may be activated to couple supply voltage for memory cells of column 655 to node 406 having supply voltage $V_{SUPPLY1}$ and PFET 893 may be deactivated to decouple supply voltage for memory cells of column 655 from node 407 having supply voltage $V_{SUPPLY2}$. In response to a second control signal corresponding to a binary value of zero output from latch 781, PFET 891 may be deactivated to decouple supply voltage for memory cells of column 655 from node 406 having supply voltage $V_{SUPPLY1}$ and PFET 893 may be activated to couple supply voltage for memory cells of column 655 to node 407 having supply voltage $V_{SUPPLY2}$.

Example System

Circuitry 200 of FIG. 2 may be used to control memory cell supply voltage based at least in part on error detection in any suitable environment. Circuitry 200 for one embodiment, as illustrated in FIG. 9, may be used in a system 900.

Figure 9:
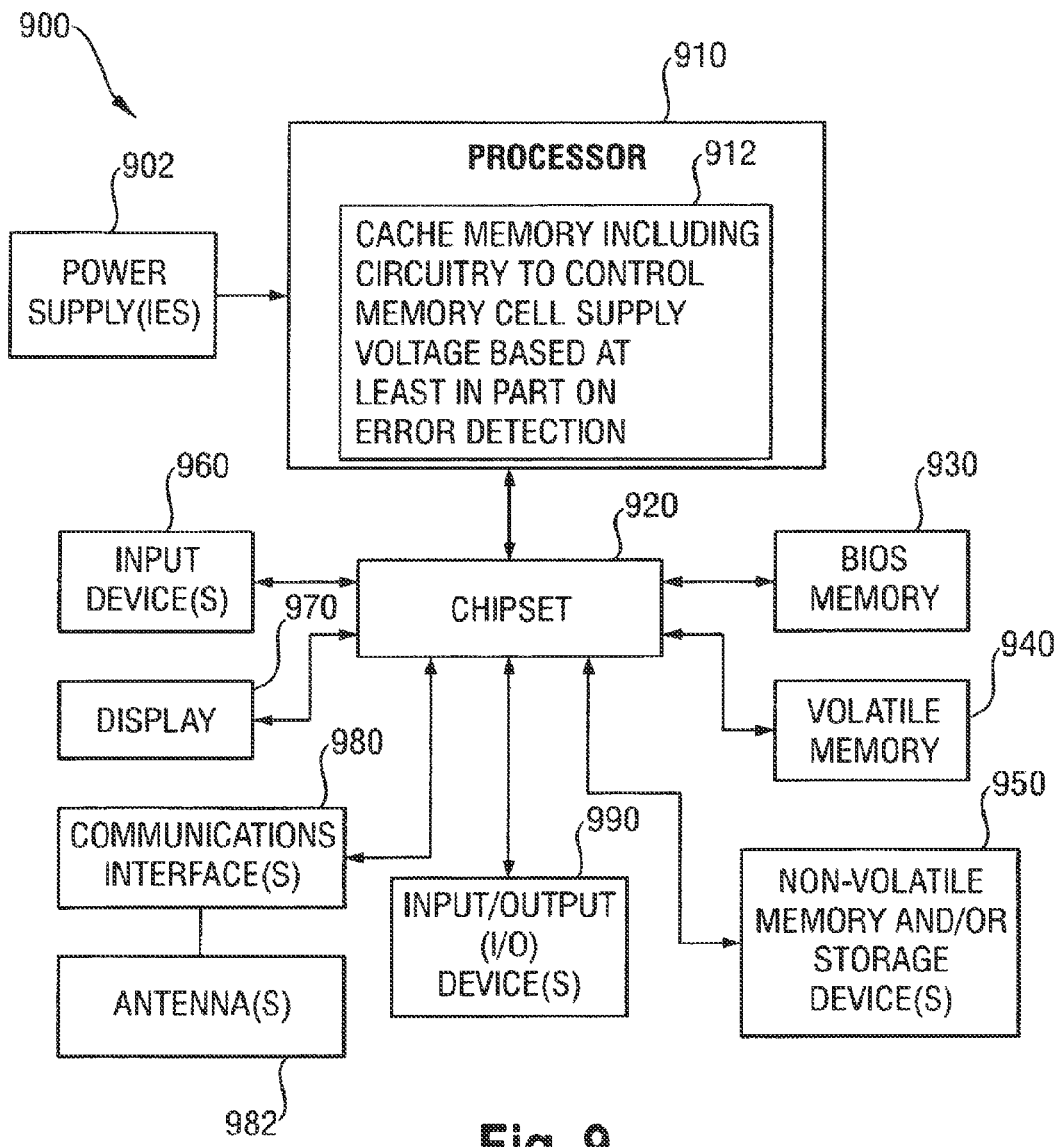
FIG. 9 illustrates, for one embodiment, a block diagram of an example system comprising a processor having a cache memory including circuitry to control memory cell supply voltage based at least in part on error detection.

As illustrated in FIG. 9, system 900 for one embodiment may comprise a processor 910 having a cache memory 912 including circuitry 200 to control memory cell supply voltage based at least in part on error detection. Although illustrated as a part of processor 910 for one embodiment, cache memory 912 for another embodiment may be separate from processor 910. System 900 for another embodiment may include multiple processors one or more of which may have cache memory similar to cache memory 912.

Processor 910 for one embodiment may be coupled to receive power from one or more power supplies 902. Power supply(ies) 902 for one embodiment may correspond to power supply(ies) 402 of FIG. 4.

System 900 for one embodiment may also include a chipset 920 coupled to processor 910, a basic input/output system (BIOS) memory 930 coupled to chipset 920, volatile memory 940 coupled to chipset 920, non-volatile memory and/or storage device(s) 950 coupled to chipset 920, one or more input devices 960 coupled to chipset 920, a display 970 coupled to chipset 920, one or more communications interfaces 980 coupled to chipset 920, and/or one or more other input/output (I/O) devices 990 coupled to chipset 920.

Chipset 920 for one embodiment may include any suitable interface controllers to provide for any suitable communications link to processor 910 and/or to any suitable device or component in communication with chipset 920.

Chipset 920 for one embodiment may include a firmware controller to provide an interface to BIOS memory 930. BIOS memory 930 may be used to store any suitable system and/or video BIOS software for system 900. BIOS memory 930 may include any suitable non-volatile memory, such as a suitable flash memory for example. BIOS memory 930 for one embodiment may alternatively be included in chipset 920.

Chipset 920 for one embodiment may include one or more memory controllers to provide an interface to volatile memory 940. Volatile memory 940 may be used to load and store data and/or instructions, for example, for system 900. Volatile memory 940 may include any suitable volatile memory, such as suitable dynamic random access memory (DRAM) for example. Processor 910 for one embodiment may use cache memory 912 to store data and/or instructions stored or to be stored in volatile memory 940, for example, for faster access to such data and/or instructions.

Chipset 920 for one embodiment may include a graphics controller to provide an interface to display 970. Display 970 may include any suitable display, such as a cathode ray tube (CRT) or a liquid crystal display (LCD) for example. The graphics controller for one embodiment may alternatively be external to chipset 920.

Chipset 920 for one embodiment may include one or more input/output (I/O) controllers to provide an interface to non-volatile memory and/or storage device(s) 950, input device(s) 960, communications interface(s) 980, and/or I/O devices 990.

Non-volatile memory and/or storage device(s) 950 may be used to store data and/or instructions, for example. Non-volatile memory and/or storage device(s) 950 may include any suitable non-volatile memory, such as flash memory for example, and/or may include any suitable non-volatile storage device(s), such as one or more hard disk drives (HDDs), one or more compact disc (CD) drives, and/or one or more digital versatile disc (DVD) drives for example.

Input device(s) 960 may include any suitable input device(s), such as a keyboard, a mouse, and/or any other suitable cursor control device.

Communications interface(s) 980 may provide an interface for system 900 to communicate over one or more networks and/or with any other suitable device. Communications interface(s) 980 may include any suitable hardware and/or firmware. Communications interface(s) 980 for one embodiment may include, for example, a network adapter, a wireless network adapter, a telephone modem, and/or a wireless modem. For wireless communications, communications interface(s) 980 for one embodiment may use one or more antennas 982.

I/O device(s) 990 may include any suitable I/O device(s) such as, for example, an audio device to help convert sound into corresponding digital signals and/or to help convert digital signals into corresponding sound, a camera, a camcorder, a printer, and/or a scanner.

Although described as residing in chipset 920, one or more controllers of chipset 920 may be integrated with processor 910, allowing processor 910 to communicate with one or more devices or components directly. As one example, one or more memory controllers for one embodiment may be integrated with processor 910, allowing processor 910 to communicate with volatile memory 940 directly.

In the foregoing description, example embodiments have been described. Various modifications and changes may be made to such embodiments without departing from the scope of the appended claims. The description and drawings are, accordingly, to be regarded in an illustrative rather than a restrictive sense.

What is claimed is:

1. An apparatus comprising:
    a memory circuitry including memory cells in columns, the memory circuitry to receive first and second power supply voltages, wherein the first power supply voltage is higher than the second power supply voltage;
    an error detection circuitry to detect error in data stored by the memory cells of the memory circuitry; and
    a supply voltage control circuitry operable to:
        provide the first power supply voltage for those columns of memory cells of the memory circuitry that are associated with the detected error,
        provide the second power supply voltage for those columns of memory cells that store error free data; and
        provide, after reset or after power UP, the first power supply voltage again for those columns of memory cells of the memory circuitry that are associated with the detected error.

2. The apparatus of claim 1, wherein the supply voltage control circuitry is to provide the first supply voltage for a predetermined subset of memory cells that include one or more memory cells having error.

3. The apparatus of claim 1, wherein the memory circuitry includes access control circuitry to identify accessed memory cells and the supply voltage control circuitry is to provide the first supply voltage for one or more accessed memory cells.

4. The apparatus of claim 1, wherein the supply voltage control circuitry is to switch to the first supply voltage for one or more memory cells to a greater voltage than the voltage of the second power supply.

5. The apparatus of claim 4, comprising charge pump circuitry to generate the greater voltage.

6. The apparatus of claim 1, wherein the error detection circuitry is to generate error detection data for data to be written to memory cells of the memory circuitry and is to use error detection data to detect error.

7. The apparatus of claim 1, wherein the error detection circuitry is to use error detection data stored by memory cells of the memory circuitry in association with data read from memory cells of the memory circuitry to detect error in the read data.

8. The apparatus of claim 1, wherein the error detection circuitry is to correct detected error.

9. The apparatus of claim 1, wherein the error detection circuitry is to use error correction code.

10. The apparatus of claim 1, wherein the memory cells include one or more static random access memory cells.

11. An apparatus comprising:
    means for detecting error in data stored by columns of memory cells in columns, the memory cells to receive first and second power supply voltages, wherein the first power supply voltage is higher than the second power supply voltage;
    means for providing the first power supply voltage for the columns of memory cells that are associated with the detected error;
    means for providing the second power supply voltage for the columns of memory cells that store error free data; and means for providing, after reset or after power up, the first power supply voltage again for those columns of memory cells of the memory circuitry that are associated with the detected error.

12. The apparatus of claim 11, wherein the means for providing the first supply voltage includes means for increasing supply voltage for a predetermined subset of memory cells that include one or more memory cells having error.

13. The apparatus of claim 11, comprising means for correcting detected error.

14. A method comprising:
detecting error in data stored by memory cells in columns, the memory cells to receive first and second power supply voltages, wherein the first power supply voltage is higher than the second power supply voltage;
providing the first power supply voltage for the columns of the memory cells that are associated with the detected error;
providing the second power supply voltage for the columns of the memory cells that store error free data; and
providing, after reset or after power up, the first power supply voltage again for those columns of memory cells of the memory circuitry that are associated with the detected error.

15. The method of claim 14, wherein the the first power supply includes increasing supply voltage for a predetermined subset of memory cells that include one or more memory cells having error.

16. The method of claim 14, comprising identifying accessed memory cells;
wherein the providing the first power supply includes increasing supply voltage for one or more accessed memory cells.

17. The method of claim 14, wherein the providing the first power supply includes switching supply voltage for one or more memory cells to a greater voltage.

18. The method of claim 14, comprising generating error detection data for data to be written to memory cells;
wherein the detecting error includes using error detection data.

19. The method of claim 14, comprising correcting detected error.

20. A system comprising:
a volatile memory; and
a processor including:
a cache memory, the cache memory including memory circuitry including those columns of memory cells, the memory circuitry to receive first and second power supply voltages, wherein the first power supply voltage is higher than the second power supply voltage;
an error detection circuitry to detect error in data stored by the memory cells of the memory circuitry; and
a supply voltage control circuitry to:
provide the first power supply voltage for those columns of memory cells of the memory circuitry that are associated with the detected error,
provide the second power supply voltage the columns of memory cells that store error free data; and
provide, after reset or after power up, the first power supply voltage again for those columns of memory cells of the memory circuitry that are associated with the detected error.

21. The system of claim 20, wherein the supply voltage control circuitry is to provide the first power supply voltage for a predetermined subset of memory cells that include one or more memory cells having error.

22. The system of claim 20, wherein the error detection circuitry is to correct detected error.

* * * * *